United States Patent [19]

Collins

[11] Patent Number: 4,951,009

[45] Date of Patent: Aug. 21, 1990

[54] TUNING METHOD AND CONTROL SYSTEM FOR AUTOMATIC MATCHING NETWORK

[75] Inventor: Kenneth S. Collins, San Jose, Calif.

[73] Assignee: Applied Materials, Inc., Santa Clara, Calif.

[21] Appl. No.: 392,874

[22] Filed: Aug. 11, 1989

[51] Int. Cl.⁵ ............................................. H03H 11/30
[52] U.S. Cl. ..................................... 333/17.3; 333/32
[58] Field of Search ................. 333/17.3, 32; 343/861; 455/125

[56]  References Cited

U.S. PATENT DOCUMENTS

| 2,611,030 | 9/1952 | Sontheimer | 333/17.1 |
| 2,884,632 | 4/1959 | Dewitz et al. | 333/17.3 X |
| 4,015,223 | 3/1977 | Cheze | 333/17.3 |
| 4,375,051 | 2/1983 | Theall | 333/17.3 |
| 4,493,112 | 1/1985 | Bruene | 333/17.3 X |

FOREIGN PATENT DOCUMENTS 2115740  12/1977  Fed. Rep. of Germany ..... 333/17.3

Primary Examiner—Paul Gensler
Attorney, Agent, or Firm—Paul L. Hickman; Douglas Weller

[57]     ABSTRACT

A matching network matches an output impedance of a generator with an input impedance of a load. The matching network includes a first variable impedance element, a second variable impedance element, a reflected power detector and a control circuit. Each of the first variable impedance elements are constructed using magnetically saturable reactors. For example, each magnetically saturable reactor may be a transformer composed of primary and secondary windings wound around a non-linear ferromagnetic core. The reflected power detector detects power reflected from the matching network to the generator. The control circuit receives from the reflected power detector a signal which represents the changes in reflected power. Using this feedback the control means varies the impedance through the first variable impedance element and the second variable impedance element until the reflected power is negligible. The control circuit then separates out the component of the change in reflected power which is due to dithering of the first variable impedance element from the change in reflected power which is due to dithering of the second variable impedance element. Using the components of change, the control circuit continuously varies the steady state impedance of the first variable impedance and the steady state impedance of the second variable impedance in directions which minimize the reflected power.

35 Claims, 10 Drawing Sheets

TUNING METHOD AND CONTROL SYSTEM FOR AUTOMATIC MATCHING NETWORK

BACKGROUND

The present invention concerns the connection of a first electrical circuit to a second electrical circuit using a matching network so as to provide maximum power transfer between the first electrical circuit (the "source") and the second electrical circuit (the "load").

Maximum power is transferred from the source to the load when the output impedance of the source is the complex conjugate of the input impedance of the load. In most cases the output impedance of the source is not naturally equal to the complex conjugate of the input impedance of the load; therefore matching networks are placed between the source and load when power control and efficiency are critical. A matching network operates properly when the input impedance of the matching network is the complex conjugate of the output impedance of the source, and the output impedance of the matching network is the complex conjugate of the input impedance of the load. In this way power may be transferred from a source through a matching network to a load with minimal loss of power through power reflection, heat dissipation, etc.

In cases where the input impedance of the load varies during operation it is necessary to make adjustments to the matching network to maintain maximum power transfer from the source to the load. Typically, matching networks are designed such that variations in the input impedance of the load will result in a variation of the impedance of the matching network, the input impedance of the matching network being held constant. Further, in many applications the output impedance of a source is an output resistance with a negligible imaginary component. Therefore, in some prior art applications, the impedance magnitude and the impedance phase angle is measured at the input of the matching networks. Variable capacitors or inductors within the matching network are varied until the input impedance of the matching network matches the output impedance of the source network, that is until the impedance phase angle is zero and the impedance magnitude matches the magnitude of the output resistance of the source. The variable capacitors or inductors are placed in the matching network so that for every predicted variance in the input impedance of the load there is a solution in which the variable capacitors are set to values so that for the input of the matching network the impedance phase angle is zero and the impedance magnitude matches the magnitude of the output resistance of the source.

One problem with such prior art systems is that although there may be only one unique (or correct) solution in which the variable capacitors or inductors are set to values so that for the input of the matching network both the impedance phase angle is zero and the impedance magnitude matches the magnitude of the output resistance of the source; nevertheless, multiple solutions (i.e., false solutions) may exist where the variable capacitors are set to values so that for the input of the matching network either the impedance phase angle is zero or the impedance magnitude matches the magnitude of the output resistance of the source (but not both). This makes it difficult for a matching network to detect the unique or correct solution. The result may be that the matching network converges on a false solution, oscillates between multiple solutions or diverges completely.

In some applications, where the input of the impedance of the load does not vary significantly, it may be possible to initialize the variable capacitors or inductors to values which are close to the unique solution. This increases the likelihood that the matching network will converge on the correct solution.

Additionally, another method attempted in the prior art for adjusting the matching network to take into account variations in the input impedance of the load during operation is to measure reflected power at the input of the matching network. Under manual or computer control each of the variable capacitors or inductors, in turn, is varied while the other variable capacitors or inductors are held at constant values. By such iteration it is hoped to find a value for each variable capacitor so that the reflected power is as small as possible.

An additional problem with all the above-discussed prior art systems is that each solution relies on the use of variable capacitors or inductors in which capacitance is varied mechanically. In some applications, for example where the load impedance is generated by the application of current through a plasma used is semiconductor manufacturing processes, the use of mechanically variable capacitors may introduce significant delay into the process.

SUMMARY OF THE INVENTION

In accordance with the preferred embodiment of the present invention, a matching network is presented. The matching network matches an output impedance of a generator with an input impedance of a load. The matching network includes a first variable impedance element, a second variable impedance element, a reflected power detector and a control circuit.

In the preferred embodiment each of the first variable impedance elements are constructed using magnetically saturable reactors. For example, each magnetically saturable reactor may be a transformer composed of primary and secondary windings wound around a non-linear ferromagnetic core.

The reflected power detector detects power reflected from the matching network to the generator. The control circuit receives from the reflected power detector a band pass filtered signal which represents the deviation in reflected power. Using this feedback the control means varies the impedance through the first variable impedance element and the second variable impedance element until the reflected power is negligible.

Three embodiments of the control circuit are presented, all of which use "dithering". What is meant by dithering is varying at a known frequency or frequencies the impedance through the first variable impedance element and the impedance through the second variable impedance element. The control circuit then separates out the component of the change in reflected power which is due to dithering of the first variable impedance element from the change in reflected power which is due to dithering of the second variable impedance element. Using the components of change, the control circuit continuously varies the steady state impedance of the first variable impedance and the steady state impedance of the second variable impedance in directions which minimize the reflected power. In the first embodiment, the control circuit dithers the impedance of the first variable impedance element and the second variable impedance element at the same frequency but out of phase. In the second embodiment, the control circuit dithers the impedance of the first variable impedance element and the second variable impedance element at the different frequencies. In the third embodiment, the control circuit dithers the impedance of the first variable impedance element and the second variable impedance element using a series of pulses which are at the same frequency but out of phase.

The presented matching network does not suffer from the problem of multiple erroneous solutions. Further the dithered method of tuning and control always converges to a unique matching solution, even for non-linear, dynamic loads. Convergence can be very fast by using high dither frequencies and magnetic dithering. The use of saturable reactors allows the variance of matching network impedance elements quickly and without moving parts. The present invention may be applied in various fields, for example in manufacturing processes using plasma, in induction or dielectric heating, in ultrasonic power supplies, in nuclear magnetic resonance (NMR) power supplies, in broadband antennas, in interstage coupling of power amplifiers, in any other application where maximum power transfer is required to variable impedance loads, including dynamic, non-linear loads.

DESCRIPTION OF THE PREFERRED EMBODIMENT

Figure 1:
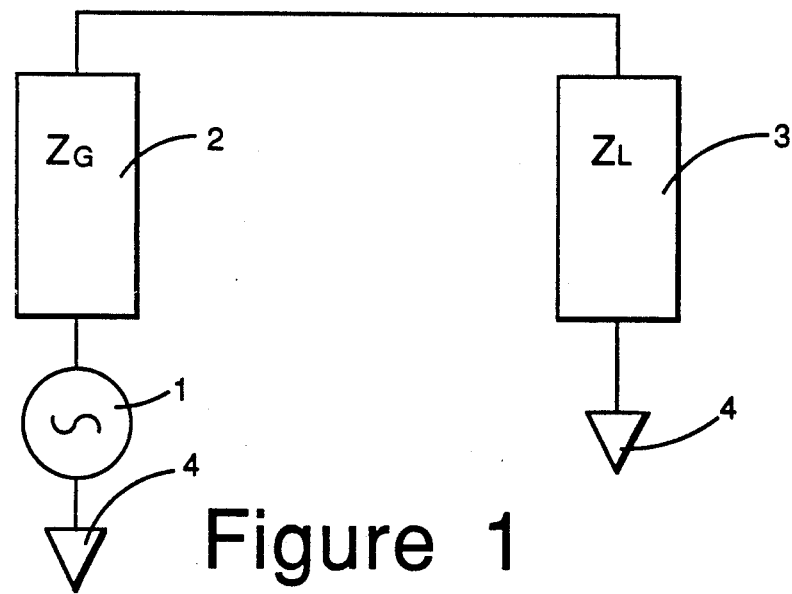
FIG. 1 shows a power generator with driving a load.

In FIG. 1 a generator 1 has a generator output impedance 2. Generator 1 is used to drive a load 3. Generator 1 and load 3 are both connected to a ground 4. Maximum power transfer from generator 1 to load 3 occurs when the input impedance of load 3 is the complex conjugate of the output impedance of generator impedance 2.

Figure 2:
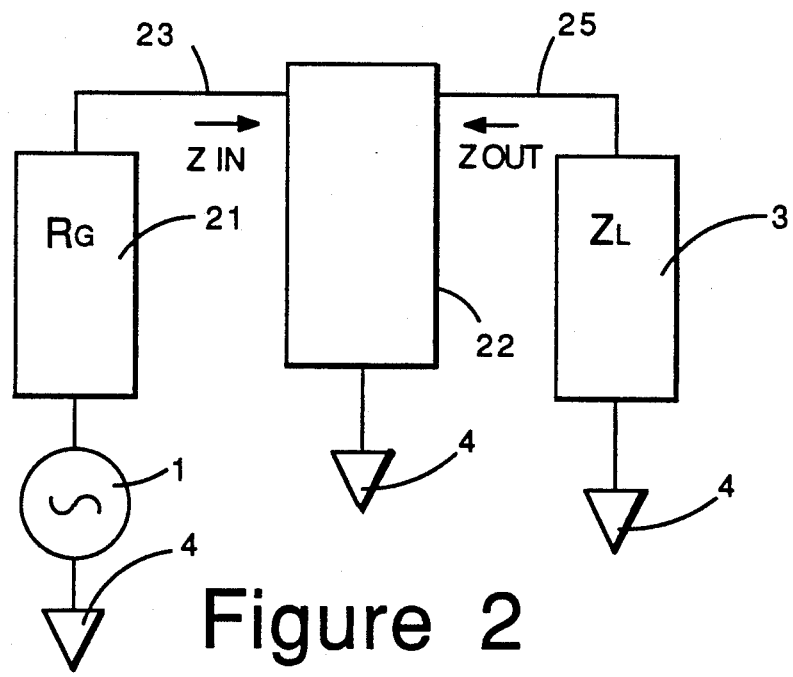
FIG. 2 shows a matching network between a generator resistance and the load of FIG. 1 in order to maximize power transfer.

In FIG. 2 generator impedance 2 is shown to be composed of a resistance 21 associated with generator 1 and a matching network 22 which has been introduced to maximize power transfer from generator 1 to load 3. At optimum performance, at a location 23 the output impedance of resistance 21 is the complex conjugate of the input impedance of matching network 22, and at a location 25 the output impedance of matching network 22 is the complex conjugate of the input impedance of load 3.

Figure 3:
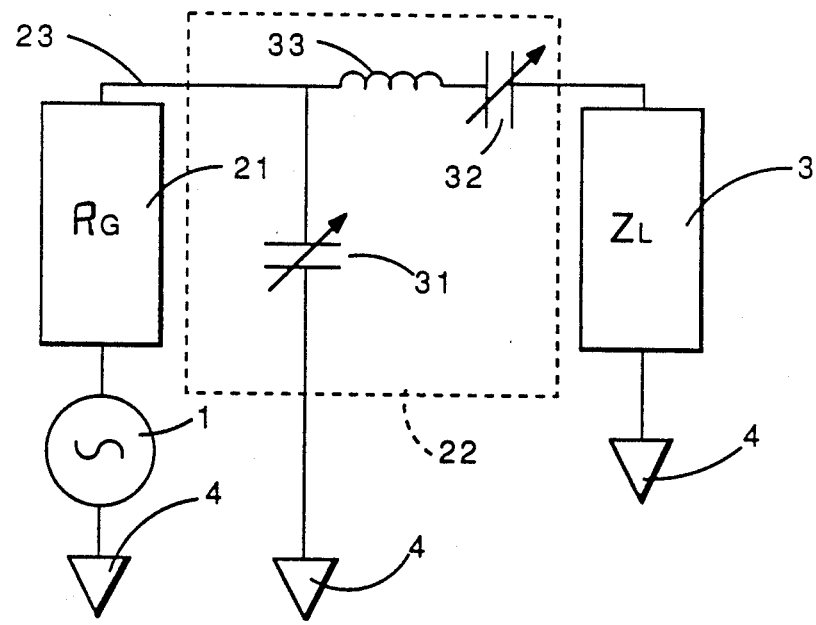
FIG. 3 shows an example of a prior art matching network.

FIG. 3 shows a prior version of a matching network. The matching network consists of a variable capacitor 31, a variable capacitor 32 and an inductor 33 connected as shown. The capacitance of capacitors 31 and 32 is varied mechanically be servo-motors. Typically the capacitance of capacitors 31 and 32 are varied until at location 23 the input impedance of matching network 22 has an impedance angle zero (i.e., there is no imaginary component) and has a magnitude equal to the magnitude of generator resistance 21. The shortcomings of this circuit when used in certain applications have been discussed in the Background above.

Figure 4A:
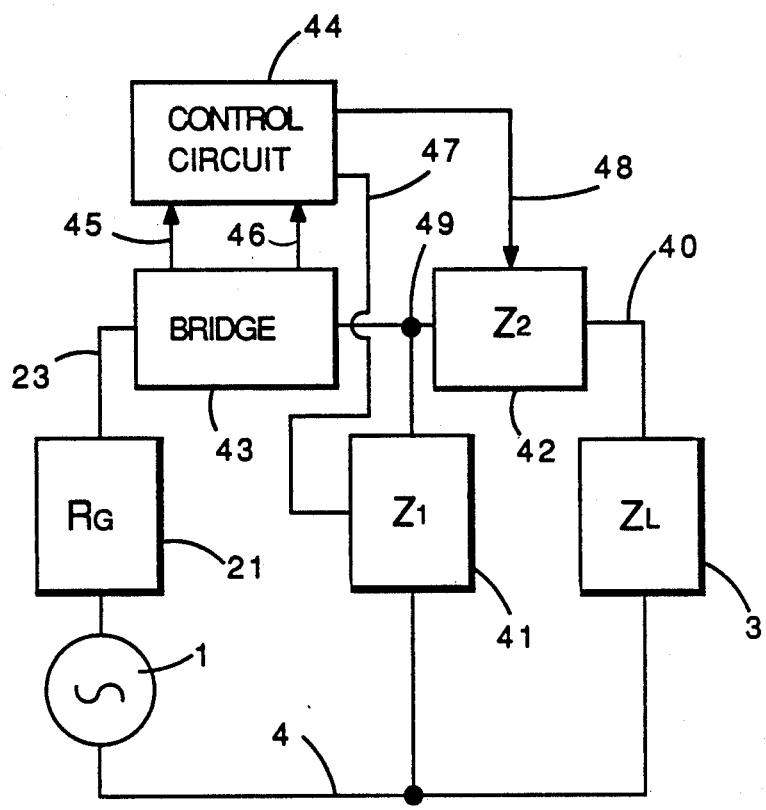
FIG. 4A shows a matching network in accordance with the preferred embodiment of the present invention.

In FIG. 4A a matching network in accordance with the preferred embodiment of the present invention is shown. The matching network includes a bridge 43, a control circuit 44, an impedance circuit 41 and an impedance circuit 42 connected as shown. Impedance circuit 41 and impedance circuit 42 are connected in an "L" network. An "L" network in the direction shown can generally be used when the resistance component of load 3 is less than generator resistance 21. For correlation to later Figures a reference location 49 and a reference location 40 are shown.

Figure 4B:
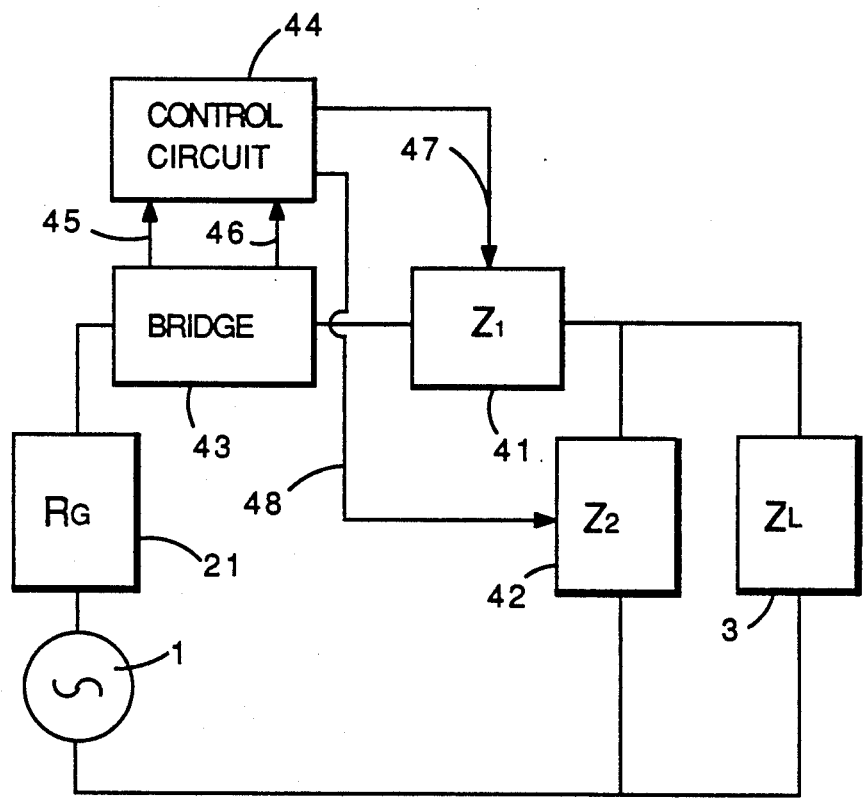
FIG. 4B and FIG. 4C show alternate embodiments of matching networks in accordance with the present invention.

The present invention applies to any arbitrary network topology within a matching network, not just the network shown in FIG. 4A. For example, in FIG. 4B, the components of the matching network of FIG. 4A are shown connected in another "L" network, reversed from the "L" network of FIG. 4A. This "L" network is preferred when the resistive component of load 3 is greater than the generator resistance 21.

Bridge 43 is a directional coupler. Bridge 43 produces a power reflection signal on a line 45 which indicates the instantaneous amount of power reflected from the matching network at location 23. Bridge 43 also produces a power forward signal on a line 46 which indicates the instantaneous amount of power which is forwarded through the matching network. Control circuit 44 controls the value of the impedance of impedance circuit 41 by a control signal placed on a line 47. Control circuit 44 also controls the value of the impedance of impedance circuit 42 by a control signal placed on a line 48. Utilizing the power reflection signal on line 45 and the power forward signal on line 46, control circuit 44 varies the impedance through impedance circuit 41 and the impedance through impedance circuit 42 so that the power reflected by the matching network at location 23 is negligible. This is done by varying (or dithering) the current level of the signals on line 47 and line 48 and the determining whether dithering the current level reduces the power reflected by the matching network or increases it. The signals on line 47 and line 48 each have a DC component which is increased or decreased in order to minimize the reflected power. The current range over which the signals on line 47 and line 48 are dithered is reduced as the reflected power approaches zero. This allows for automatic coarse and fine tuning of impedance circuit 41 and impedance circuit 42.

Figure 4C:
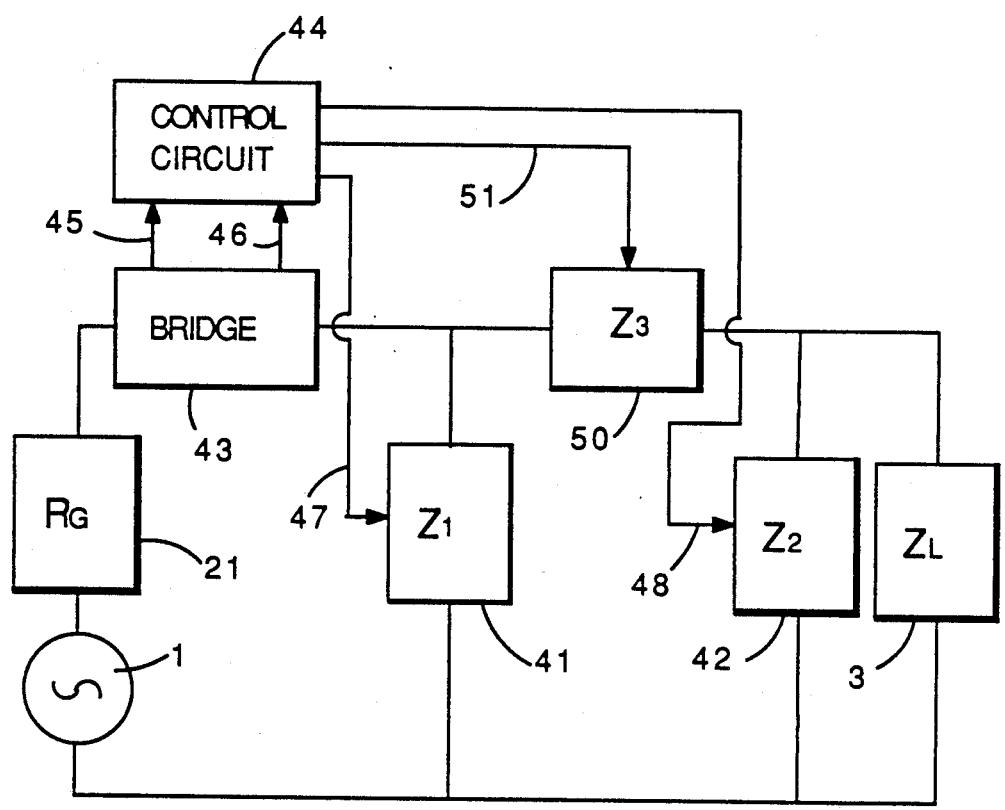

With the addition of an impedance circuit 50 and a control line 51 a pi network may be formed as shown in FIG. 4C. The existence of three impedance circuits 41, 42 and 50 means that one of the impedance circuits is redundant. Thus control circuit 44 may hold one of the three impedance circuits 41, 42 and 50 constant while varying the other two in order to correctly match impedance.

Figure 5:
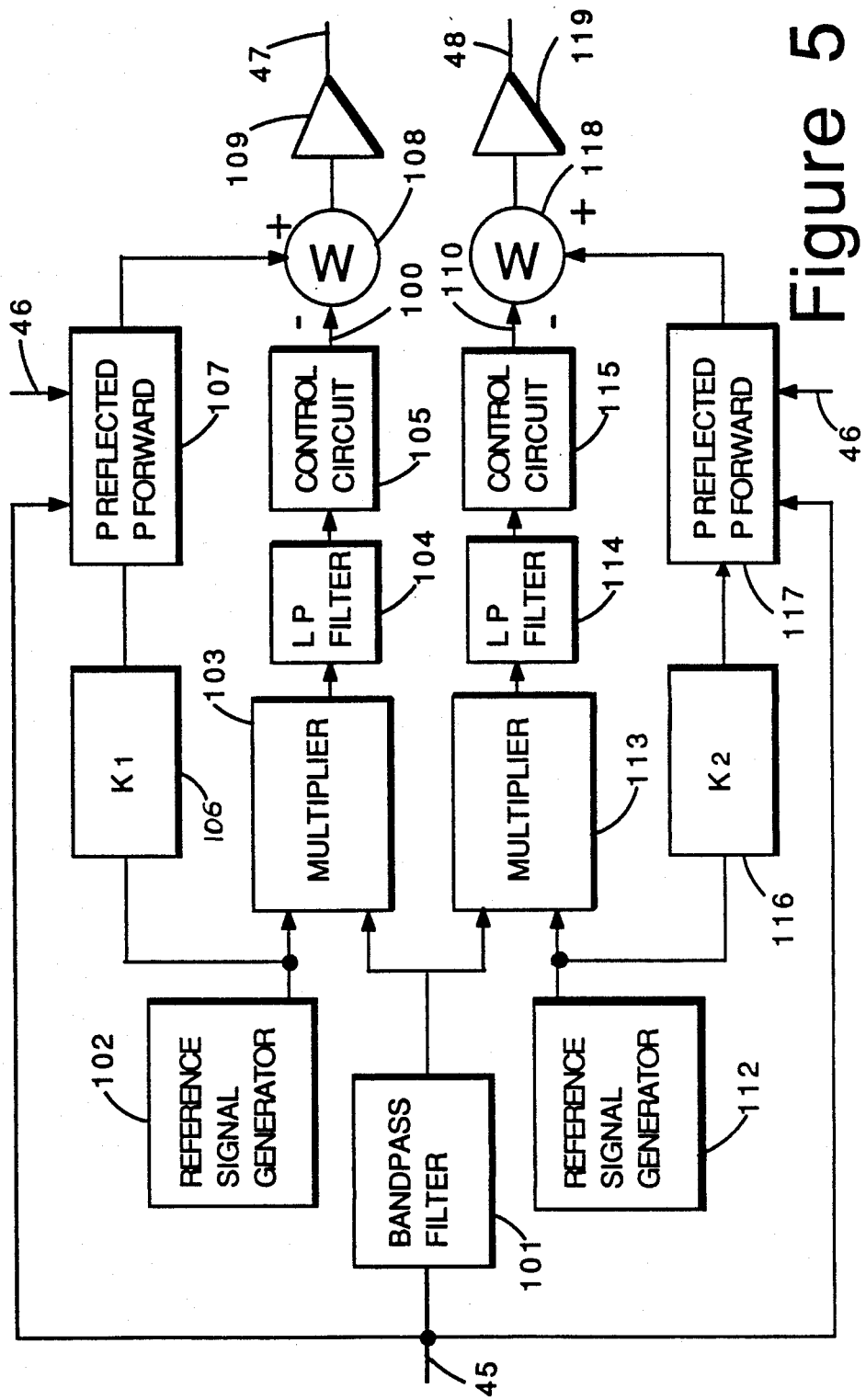
FIG. 5 shows an implementation of a control circuit within the matching network shown in FIG. 4 in accordance with a preferred embodiment of the present invention.
Figure 7A:
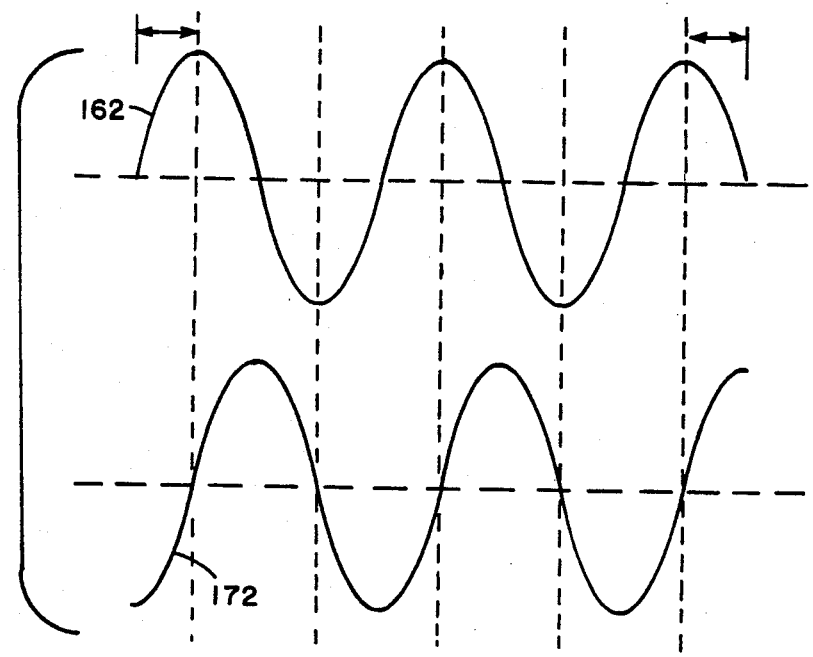
FIG. 7A shows a first set of wave forms which may be used as reference signals in the control circuit shown in FIG. 5 in accordance with the preferred embodiment of the present invention.

FIG. 5 shows an embodiment of control circuit 44. A bandpass filter 101 receives the power reflected signal from line 45. Bandpass filter 101 filters out all components of the power reflected signal except the component of the power reflected signal which oscillates at a frequency approximately equal to the frequency of oscillation of a signal 162 generated by a reference signal generator 102 and a signal 172 generated by a reference signal generator 112. Signal 162 and signal 172 are shown in FIG. 7A to be sine waves oscillating 90 degrees out of phase.

The filtered signal produced by bandpass filter 101 is received by a multiplier 103 and a multiplier 113. Multiplier 103 multiplies the voltage of the signal from bandpass filter 101 by the voltage of the signal from reference signal generator 102. The output of multiplier 103 is received by a low pass (LP) filter 104. Low pass filter 104 generates a DC signal whose voltage level varies based on the phase difference between the signal from bandpass filter 101 and the signal from reference signal generator 102. When the signal from bandpass filter 101 oscillates in phase with the signal from reference signal generator 102, the DC signal generated by low pass filter 104 is at a maximum positive voltage. When the signal from bandpass filter 101 oscillates 180 degrees out of phase with the signal from reference signal generator 102, the DC signal generated by low pass filter 104 is at a maximum negative voltage. When the signal from bandpass filter 101 oscillates 90 degrees out of phase with the signal from reference signal generator 102, the DC signal generated by low pass filter 104 is at a reference voltage half way between the maximum positive voltage and the maximum negative voltage (i.e. approximately zero voltage).

The DC signal from low pass filter 104 is received by a control circuit 105. Control circuit 105 produces a control voltage on line 100 which determines the current of the DC component of the control signal placed on line 47. Control circuit 105 adjusts the value of the control voltage based on the value of the DC signal from low pass filter 104. Control circuit 105 may be implemented to vary the control voltage on line 100 an amount proportional to the voltage value of the DC signal generated by low pass filter 104. Alternately, Control circuit 105 may be implemented using a proportional plus integral scheme, or a proportional plus integral plus derivative scheme. Proportional plus integral control (PI) is generally utilized to integrate out steady state errors, thus removing a tuning dead-band. Proportional plus integral plus derivative control is generally used to improve on PI scheme control by adding anticipation capability of error signals to speed up response.

The signal from reference signal generator 102 is also received by an amplifier 106 which multiplies the voltage of the signal from reference signal generator 102 by a constant value. The signal generated by amplifier 106 is received by an amplifier 107. Amplifier 107 also receives as input the power reflected signal on line 45 and the power forward signal on line 46. Amplifier 107 multiplies the voltage of the signal from amplifier 106 by an amount equal to the ratio of the power reflected signal on line 45 to the power forward signal on line 46. The signal produced by amplifier 107 produces the oscillating component of the control signal placed on line 47. When the voltage of the power reflected signal is relatively large compared to the power forward signal, this means that the matching network is fairly far from correctly matching impedances. Therefore, the control signal placed on line 47 has a fairly large oscillating component. When the power reflected signal approaches 0, this indicates the matching network is fairly close to matching impedances; therefore, a smaller oscillating component of the control signal on line 47 is needed to allow for finer adjustments to the matching network.

A summing circuit 108 sums the signals from control circuit 105 and the signal from amplifier 107. A current amplifier 109 amplifies the signal produced by summing circuit 108.

Multiplier 113 multiplies the voltage of the signal from bandpass filter 101 and the voltage of the signal from reference signal generator 112. The output of multiplier 113 is received by a low pass filter 114. Low pass filter 114 generates a DC signal whose voltage level varies based on the phase difference between the signal from bandpass filter 101 and the signal from reference signal generator 112. When the signal from bandpass filter 101 oscillates in phase with the signal from reference signal generator 112, the DC signal generated by low pass filter 114 is at a maximum positive voltage. When the signal from bandpass filter 101 oscillates 180 degrees out of phase with the signal from reference signal generator 112, the DC signal generated by low pass filter 114 is at a maximum negative voltage. When the signal from bandpass filter 101 oscillates 90 degrees out of phase with the signal from reference signal generator 112, the DC signal generated by low pass filter 114 is at a reference voltage half way between the maximum positive voltage and the maximum negative voltage (approximately zero volts).

The DC signal from low pass filter 114 is received by a control circuit 115. Control circuit 115 produces a control voltage on line 110 which determines the current of the DC component of the control signal placed on line 48. Control circuit 115 adjusts the value of the control voltage based on the value of the DC signal from low pass filter 114. Control circuit 115 may be implemented to vary the control voltage on line 110 an amount proportional to the voltage value of the DC signal generated by low pass filter 114. Alternately, Control circuit 115 may be implemented using a proportional integral scheme, or a proportional integral derivative scheme.

The signal from reference signal generator 112 is also received by an amplifier 116 which multiplies the voltage of the signal from reference signal generator 112 by a constant value. The signal generated by amplifier 116 is received by an amplifier 117. Amplifier 117 also receives as input the power reflected signal on line 45 and the power forward signal on line 46. Amplifier 117 multiplies the voltage of the signal from amplifier 116 by an amount equal to the ratio of the power reflected signal on line 45 to the power forward signal on line 46. The signal produced by amplifier 117 produces the oscillating component of the control signal placed on line 48. When the voltage of the power reflected signal is relatively large compared to the power forward signal, this means that the matching network is fairly far from correctly matching impedances. Therefore, the control signal placed on line 48 has a fairly large oscillating component. When the power reflected signal approaches zero, this indicates the matching network is fairly close to matching impedances; therefore, a smaller oscillating component of the control signal on line 48 is needed to allow for finer adjustments to the matching network.

A summing circuit 118 sums the signals from control circuit 115 and the signal from amplifier 117. A current amplifier 119 amplifies the signal produced by summing circuit 118.

Reference signal generator 112 produces a signal which oscillates at the same frequency as the signal generated by reference signal generator 102, however, the two signals are 90 degrees out of phase. In this way it is possible for control circuit 44 to recognize the relative effect that varying the control signal on 47 has on the power reflected signal on line 45, versus varying the control signal on line 48. For example, if the power reflected signal on line 45 varies in phase with the signal generated by reference signal generator 102, this means that the control signal on line 47 is the sole cause of the variation in the power reflected. The signal from bandpass filter 101 will be in phase with the signal from the reference generator 102 and the DC component of the control signal on line 47 is adjusted a maximum amount. On the other hand, the control signal on line 48 is not affecting the variation in the reflected power. The signal from bandpass filter 101 will be 90 degrees out of phase with the signal from the reference generator 112 and no adjustment is made to the DC component of the control signal on line 48.

Figure 7B:
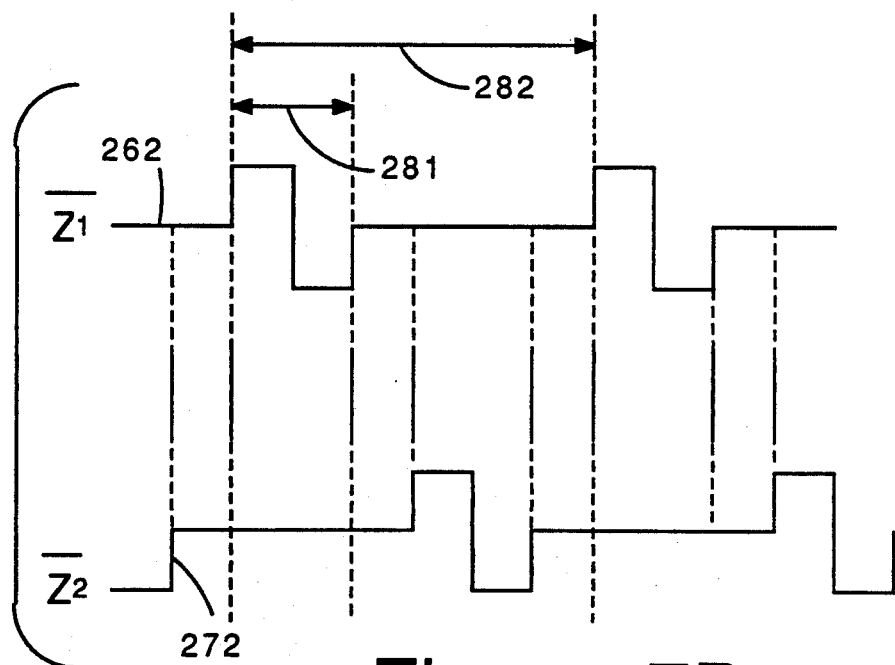
FIG. 7B shows a second set of wave forms which may be used as reference signals in the control circuit shown in FIG. 5 in accordance with an alternate preferred embodiment of the present invention.

Alternately, reference signal generator 102 and reference signal generator 112 may generate non-overlapping pulses. For example, reference signal generator 102 may generate a pulse signal 262 and reference signal generator 112 may generate a pulse signal 272 as shown in FIG. 7B. A period of time 281 represents the period of the pulse frequency. A period of time 282 represents the pulse repetition period. In implementation of this embodiment, band pass filter 101 needs to be tuned so that signals with a pulse period equal to period of time 281 pass through, but other signals are filtered out. The amount the power reflected signal on line 45 varies in phase or 180 degrees out of phase with pulses from signal 262 reflects the amount the control signal on line 47 is the cause of the variation in the power reflected. The control signal on line 47 is adjusted a related amount. Similarly, the amount the power reflected signal on line 45 varies in phases or 180 degrees out of phase with pulses from signal 272 reflects the amount the control signal on line 48 is the cause of the variation in the power reflected. The control signal on line 48 is adjusted a related amount.

Figure 6:
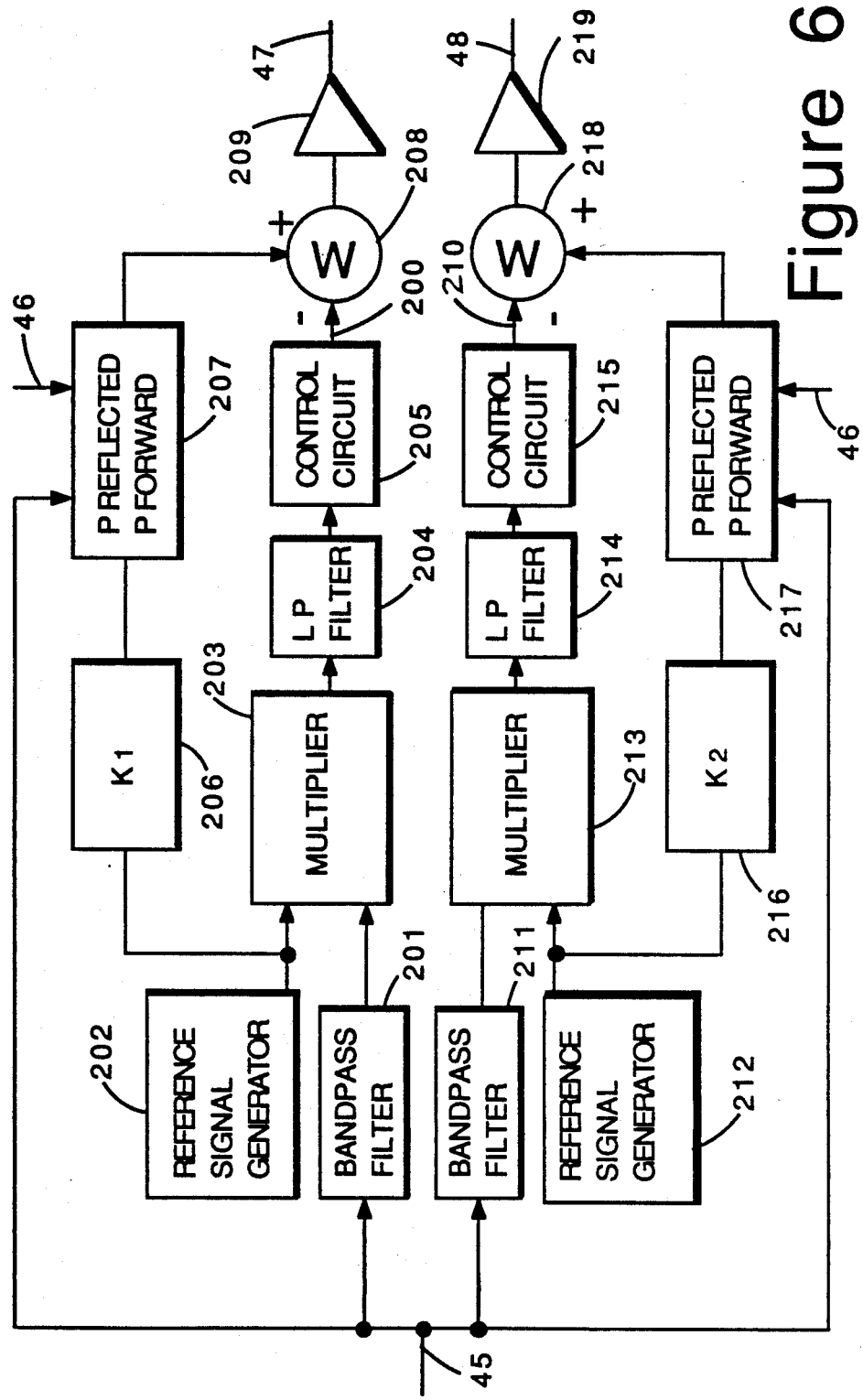
FIG. 6 shows an alternate implementation of a control circuit within the matching network shown in FIG. 4 in accordance with a preferred embodiment of the present invention.

FIG. 6 shows an alternate embodiment of control circuit 44. A bandpass filter 201 receives the power reflected signal from line 45. Bandpass filter 201 filters out all components of the power reflected signal except the component of the power reflected signal which oscillates at a frequency approximately equal to the frequency of oscillation of a signal generated by a reference signal generator 202. The filtered signal produced by bandpass filter 201 is received by a multiplier 203.

Multiplier 203 multiplies the voltage of the signal from bandpass filter 201 and the voltage of the signal from reference signal generator 202. The output of multiplier 203 is received by a low pass filter 204. Low pass filter 204 generates a DC signal whose voltage level varies based on the phase difference between the signal from bandpass filter 201 and the signal from reference signal generator 202. When the signal from bandpass filter 201 oscillates in phase with the signal from reference signal generator 202, the DC signal generated by low pass filter 204 is at a maximum positive voltage. When the signal from bandpass filter 201 oscillates 180 degrees out of phase with the signal from reference signal generator 202, the DC signal generated by low pass filter 204 is at a maximum negative voltage. When the signal from bandpass filter 201 oscillates 90 degrees out of phase with the signal from reference signal generator 202, the DC signal generated by low pass filter 204 is at a reference voltage half way between the maximum and the maximum negative voltage.

The DC signal from low pass filter 204 is received by a control circuit 205. Control circuit 205 produces a control voltage on line 200 which determines the current of the DC component of the control signal placed on line 47. Control circuit 205 adjusts the value of the control voltage based on the value of the DC signal from low pass filter 204. Control circuit 205 may be implemented to vary the control voltage on line 200 an amount proportional to the voltage value of the DC signal generated by low pass filter 204. Alternately, Control circuit 205 may be implemented using a proportional integral scheme, or a proportional integral derivative scheme.

The signal from reference signal generator 202 is also received by an amplifier 206 which multiplies the voltage of the signal from reference signal generator 202 by a constant value. The signal generated by amplifier 206 is received by an amplifier 207. Amplifier 207 also receives as input the power reflected signal on line 45 and the power forward signal on line 46. Amplifier 207 multiplies the voltage of the signal from amplifier 206 by an amount equal to the ratio of the power reflected signal on line 45 to the power forward signal on line 46. The signal produced by amplifier 207 produces the oscillating component of the control signal placed on line 47. When the voltage of the power reflected signal is relatively large compared to the power forward signal, this means that the matching network is fairly far from correctly matching impedances. Therefore, the control signal placed on line 47 has a fairly large oscillating component. When the power reflected signal approaches 0, this indicates the matching network is fairly close to matching impedances; therefore, a smaller oscillating component of the control signal on line 47 is needed to allow for finer adjustments to the matching network.

A summing circuit 208 sums the signals from control circuit 205 and the signal from amplifier 207. A current amplifier 209 amplifies the signal produced by summing circuit 208.

A bandpass filter 211 also receives the power reflected signal from line 45. Bandpass filter 211 filters out all components of the power reflected signal except the component of the power reflected signal which oscillates at a frequency approximately equal to the frequency of oscillation of a signal generated by a reference signal generator 212. The filtered signal produced by bandpass filter 211 is received by a multiplier 213.

Multiplier 213 multiplies the voltage of the signal from bandpass filter 211 and the voltage of the signal from a reference signal generator 212. The output of multiplier 213 is received by a low pass filter 214. Low pass filter 214 generates a DC signal whose voltage level varies based on the phase difference between the signal from bandpass filter 211 and the signal from reference signal generator 212. When the signal from bandpass filter 211 oscillates in phase with the signal from reference signal generator 212, the DC signal generated by low pass filter 214 is at a maximum positive voltage. When the signal from bandpass filter 211 oscillates 180 degrees out of phase with the signal from reference signal generator 212, the DC signal generated by low pass filter 214 is at a maximum negative voltage. When the signal from bandpass filter 211 oscillates 90 degrees out of phase with the signal from reference signal generator 212, the DC signal generated by low pass filter 214 is at a reference voltage half way between the maximum positive voltage and maximum negative voltage.

The DC signal from low pass filter 214 is received by a control circuit 215. Control circuit 215 produces a control voltage on line 210 which determines the current of the DC component of the control signal placed on line 48. Control circuit 215 adjusts the value of the control voltage based on the value of the DC signal from low pass filter 214. Control circuit 215 may be implemented to vary the control voltage on line 210 an amount proportional to the voltage value of the DC signal generated by low pass filter 214. Alternately, Control circuit 215 may be implemented using a proportional integral scheme, or a proportional integral derivative scheme.

The signal from reference signal generator 212 is also received by an amplifier 216 which multiplies the voltage of the signal from reference signal generator 212 by a constant value. The signal generated by amplifier 216 is received by an amplifier 217. Amplifier 217 also receives as input the power reflected signal on line 45 and the power forward signal on line 46. Amplifier 217 multiplies the voltage of the signal from amplifier 216 by an amount equal to the ratio of the power reflected signal on line 45 to the power forward signal on line 46. The signal produced by amplifier 217 produces the oscillating component of the control signal placed on line 48. When the voltage of the power reflected signal is relatively large compared to the power forward signal, this means that the matching network is fairly far from correctly matching impedances. Therefore, the control signal placed on line 48 has a fairly large oscillating component. When the power reflected signal approaches zero, this indicates the matching network is fairly close to matching impedances; therefore, a smaller oscillating component of the control signal on line 48 is needed to allow for finer adjustments to the matching network.

A summing circuit 218 sums the signals from control circuit 215 and the signal from amplifier 217. A current amplifier 219 amplifies the signal produced by summing circuit 218.

Reference signal generator 212 produces a signal which oscillates at a different frequency as the signal generated by reference signal generator 202. In this way it is possible for control circuit 44 to recognize the relative effect that varying the control signal on 47 has on the power reflected signal on line 45 versus varying the control signal on line 48.

Figure 8:
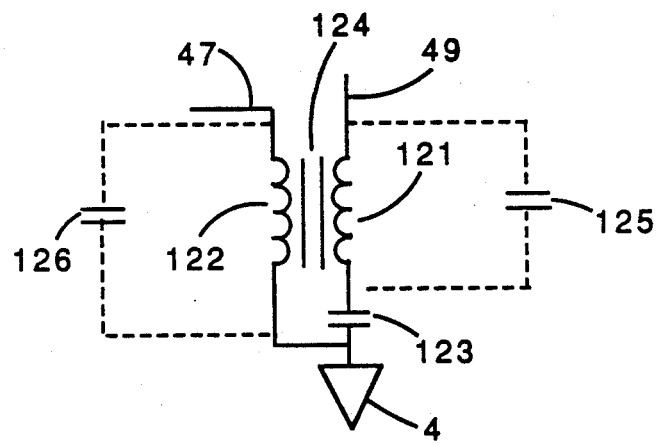
FIG. 8 shows the implementation of a first variable impedance circuit of the matching network shown in FIG. 4 in accordance with the preferred embodiment of the present invention.

In FIG. 8, a preferred embodiment of impedance circuit 41 is shown. A transformer is composed of primary windings 121 and secondary windings 122 wrapped around a non-linear ferromagnetic core 124. The magnetic properties of magnetic core 124, number of turns of primary windings 121 and number of turns of secondary windings 122 may be chosen so that varying the current through secondary windings 122 will cause the inductance of impedance circuit 41 to vary, but varying current through primary windings 121 will not cause the inductance of impedance circuit 41 to vary. A capacitance 123 represents series capacitance added to impedance circuit 41. In addition, inherent in the transformer is parasitic capacitance represented by a capacitance 125 and a capacitance 126.

Figure 10:
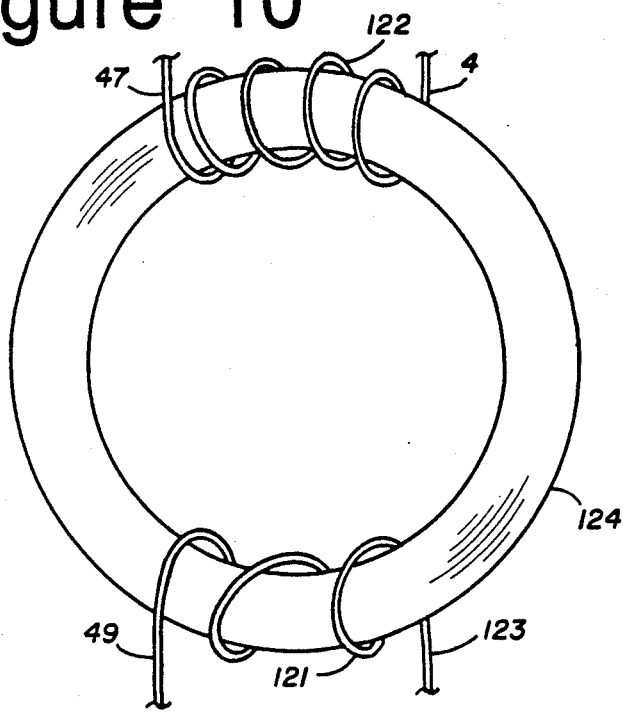
FIG. 10 shows a hardware implementation of the first variable impedance circuit shown in FIG. 8 in accordance with the preferred embodiment of the present invention.

FIG. 10 shows the transformer of FIG. 8 built on a toroidal core to minimize leakage. However, any closed magnetic path core may be used.

Figure 9:
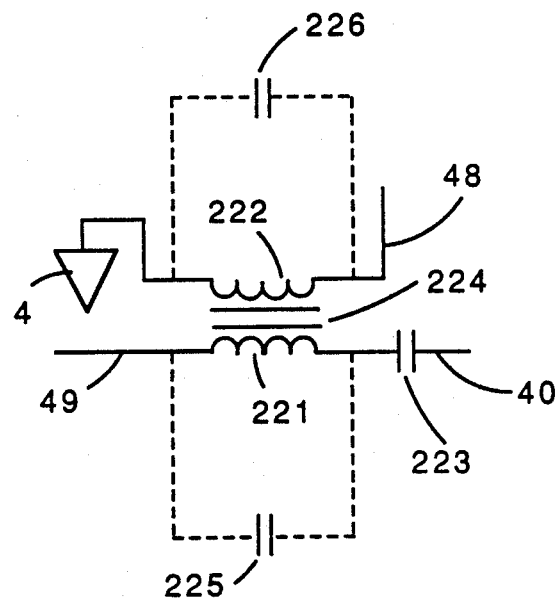
FIG. 9 shows the implementation of a second variable impedance circuit of the matching network shown in FIG. 4 in accordance with the preferred embodiment of the present invention.

In FIG. 9, a preferred embodiment of impedance circuit 42 is shown. A transformer is composed of primary windings 221 and secondary windings 222 wrapped around a non-linear ferromagnetic core 224. The magnetic properties of magnetic core 224, number of turns of primary windings 221 and number of turns of secondary windings 222 may be chosen so that varying the current through secondary windings 222 will cause the inductance of impedance circuit 42 to vary, but varying current through primary windings 221 will not cause the inductance of impedance circuit 42 to vary. A capacitance 223 represents series capacitance added to impedance circuit 41. In addition, inherent in the transformer is parasitic capacitance represented by a capacitance 225 and a capacitance 226.

Figure 11:
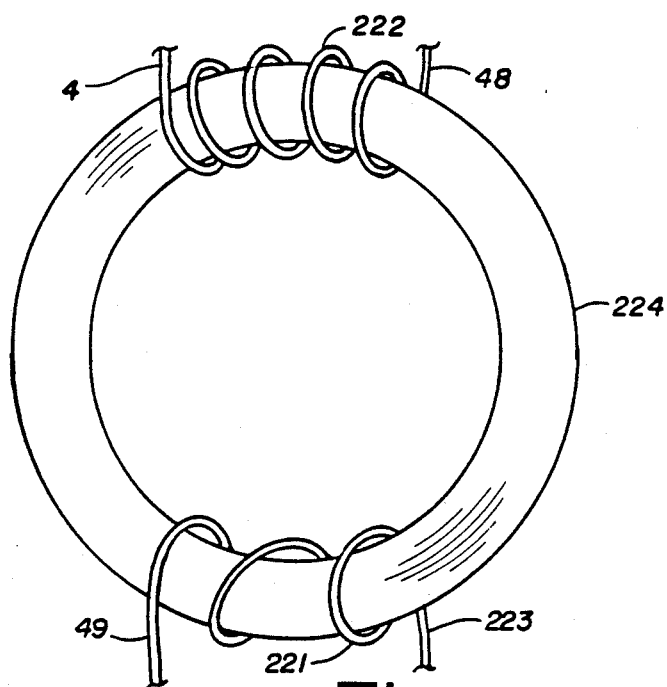
FIG. 11 shows a hardware implementation of the second variable impedance circuit shown in FIG. 9 in accordance with the preferred embodiment of the present invention.

FIG. 11 shows the transformer of FIG. 9 built on a toroidal core to minimize leakage. However, any closed magnetic patch core may be used.

The following gives an example of how values may be calculated in order to apply the present invention to a specific application. For example, the following equations are based on using the present invention to place current through a plasma used in a high frequency plasma process used to manufacture semiconductors. Table 1 defines notation for reference in equations used below;

TABLE 1

| | |
|---|---|
| $R_G$ | represents resistance 21. |
| $R_L$ | represents the resistance component of load 3. |
| $C_L$ | represents the capacitance component of load 3. |
| $R_{LMX}$ | represents the maximum value of the resistance component of load 3 for a particular application. |
| $R_{LMN}$ | represents the minimum value of the resistance component of load 3 for a particular application. |
| $C_{LMX}$ | represents the maximum value of the capacitance component of load 3 for a particular application. |
| $X_{CLMN}$ | represents the minimum value of the range of capacitive reactance (ohms) over which the capacitance component of load 3 varies. |
| $X_{CLMX}$ | represents the maximum value of the range of capacitive reactance (ohms) over which the capacitance component of load 3 varies. |
| $C_{LMN}$ | represents the minimum value of the capacitance |

TABLE 1-continued

| | |
|---|---|
| | component of load 3 for a particular application. |
| w | represents $2\pi$ times the frequency of the signal generated by generator 1 (i.e. the angular frequency). |
| $Z_1$ | represents the impedance of impedance circuit 41. |
| $Z_2$ | represents the impedance of impedance circuit 42. |
| $C_1$ | represents the capacitance of capacitor 123. |
| $C_2$ | represents the capacitance of capacitor 223. |
| $L_{1P}$ | represents the inductance of primary windings 121. |
| $L_{1S}$ | represents the inductance of secondary windings 122. |
| $L_{2P}$ | represents the inductance of primary windings 221. |
| $L_{2S}$ | represents the inductance of secondary windings 222. |
| $\mu_1$ | represents the initial relative permeability of ferromagnetic core 124 and ferromagnetic core 224. |
| $B_{sat}$ | represents the saturation flux density of ferromagnetic core 124 and ferromagnetic core 224. |
| $T_C$ | represents the curie temperature of ferromagnetic core 124 and ferromagnetic core 224. |
| ml | represents the mean magnetic path length through ferromagnetic core 124 and ferromagnetic core 224. |
| A | represents the individual cross sectional area total of each of ferromagnetic core 124 and ferromagnetic core 224. |
| OD | represents the outer diameter of each of ferromagnetic core 124 and ferromagnetic core 224. |
| ID | represents the inner diameter of each of ferromagnetic core 124 and ferromagnetic core 224. |
| Thk | represents the thickness of each of ferromagnetic core 124 and ferromagnetic core 224. |
| $N_{1P}$ | represents the number of turns of primary windings 121. |
| $N_{2P}$ | represents the number of turns of primary windings 221. |
| $N_S$ | represents the number of turns of secondary windings 122 or secondary windings 222. |
| $I_S$ | represents the current through secondary windings 122 or secondary windings 222. |
| $Z_{1R}$ | represents the range over which impedance circuit 41 varies. |
| $Z_{1MX}$ | represents the maximum value within Z1 range. |
| $Z_{1MN}$ | represents the minimum value within Z1 range. ($Z_{1R} = Z_{1MX} - Z_{1MN}$) |
| $Z_{2R}$ | represents the range over which impedance circuit 42 varies. |
| $Z_{2MX}$ | represents the maximum value within Z2 range. |
| $Z_{2MN}$ | represents the minimum value within Z2 range. ($Z_{2R} = Z_{2MX} - Z_{2MN}$) |
| $X_{L1P}$ | represents the inductive reactance of primary windings 121. |
| $X_{C1}$ | represents the capacitive reactance 123. |
| $X_{L2P}$ | represents the inductive reactance through primary windings 221. |
| $X_{C2}$ | represents the capacitive reactance 223. |

The impedance through impedance circuit 41 may be calculated using the following equation:

$$Z_1 = (R_G R_L)/(R_G R_L - R_L^2)^{\frac{1}{2}} \text{ (Pure capacitive reactance)}$$

The impedance through impedance circuit 42 may be calculated using the following equation:

$$Z_2 = (R_G R_L - R_L^2)^{\frac{1}{2}} + 1/wC_L \text{ (Pure inductive reactance)}$$

For a practical saturable ferromagnetic core, a typical variable impedance range is 20% of its nominal (unsaturated) inductance, that is, the inductance of the ferromagnetic core is variable over a range 80% to 100% of its maximum nominal inductance. After calculating $Z_{1MX}$, $Z_{1MN}$, $Z_{1R}$, $Z_{2MX}$, $Z_{2MN}$ and $Z_{2R}$ from the above relations for $Z_1$ and $Z_1$, the following equations can thus be deduced.

$$X_{L2P} = 5(Z_{2R})$$

$$X_{C2} = (0.8)(X_{L2P}) - Z_{2MN}$$

$$L_{2P} = X_{L2P}/w$$

$$C_2 = 1/wX_{C2}$$

$$X_{L1P} = 5(Z_{1R})$$

$$X_{C1} = X_{L1P} + Z_{1MN}$$

$$L_{1P} = X_{L1P}/w$$

$$C_1 = 1/wX_{C1}$$

In an application in which a high current through a plasma used in high frequency plasma process oscillates at 13.56 MHz, ferromagnetic core 124 and ferromagnetic core 224 are chosen to have the following properties:

$\mu i = 40$ $B_{sat} = 2100$ gauss $T_C = 450°$ C.

ml $= 23.9$ cm

A $= 9.68$ cm$^2$

OD $= 3.5$ in.

ID $= 2.5$ in.

Thk $= 0.5$ in.

(Maximum useable frequency is 50 megahertz)

In this case, it is seen that the number of turns of primary windings 121 and 221 and secondary windings 122 and 222 may be calculated using the following equations:

$$N_{1P} = (L_{1P} \cdot ml/4\pi \mu_i A \cdot 10^{-9})^{\frac{1}{2}}$$

$$N_{2P} = (L_{2P} \cdot ml/4\pi \mu_i A \cdot 10^{-9})^{\frac{1}{2}}$$

$$N_S \cdot I_S = B_{sat} \cdot 10 ml/4\pi \mu_i$$

For an application in which a high current through a plasma used in a high frequency plasma process oscillates at 13.56 MHz, the following values are typical for ferromagnetic core 124 and ferromagnetic core 224:

$R_{LMN} = 10$ ohms $R_{LMX} = 40$ ohms $C_{LMN} = 200$ pF $C_{LMX} = 300$ pF

The following values may then be calculated:

$X_{CLMS} = 58.7$ ohms $X_{CLMN} = 39.1$ ohms

The above given equations, therefore, may be used to derive the following values:

$Z_{2MN} = 59.1$ Ohms $Z_{2MX} = 78.7$ Ohms $Z_{1MN} = 25$ Ohms $Z_{1MX} = 100$ Ohms $Z_{2R} = 19.6$ Ohms $Z_{1R} = 75$ Ohms $X_{L2P} = 98$ Ohms $L_{2P} = 1.15 \mu H$ $X_{C2} = 19.3$ Ohms $C_2 = 608$ pF $X_{L1P} = 375$ Ohms $L_{1P} = 4.4 \mu H$ $X_{C1} = 400$ Ohms $C_1 = 29$ pF $N_{2P} = 2.4$ $N_{1P} = 4.6$ $N_S \cdot I_S = 999$ Amps·turns It is recommended that NS be as small as possible to minimize parasitic capacitance. This is because secondary capacitive reactance is reflected into the primary with impedance ratio equal to the square of the transformer turns ratio. For $N_S$, six turns when $I_S$ is 100 amperes results in 60% saturation. This is sufficient to provide the 20% impedance range.

I claim:

1. In a system with a power generator having an output impedance and a load having an input impedance, a method for using a matching network to match the output impedance of the power generator and the input impedance of the load, the matching network including a first magnetically saturable reactor composed of a transformer having primary and secondary windings wound around a non-linear ferromagnetic core and a second magnetically saturable reactor composed of a transformer having primary and secondary windings wound around a non-linear ferromagnetic core, the method comprising the steps of:
   (a) varying, by use of a first current amplifier, current through the secondary winding of the first magnetically saturable reactor at a first determined frequency;
   (b) varying, by use of a second current amplifier, current through the secondary winding of the second magnetically saturable reactor at a second determined frequency;
   (c) detecting changes in power reflected from the matching network to the power generator;
   (d) for the changes in power detected in step (c) separating an electrical component of change due to the varying of the current through the secondary winding of the first magnetically saturable reactor in step (a) from an electrical component of change due to the varying of the current through the secondary winding of the second magnetically saturable reactor in step (b); and
   (e) adjusting steady state current through the secondary winding of the first magnetically saturable reactor and current through the secondary winding of the second magnetically saturable reactor based on the electrical components separated in step (d).

2. A method as in claim 1 wherein the first determined frequency equals the second determined frequency and wherein the varying of the current through the secondary winding of the second magnetically saturable reactor in step (b) is out of phase with the varying of the current through the secondary winding of the first magnetically saturable reactor in step (a).

3. A method as in claim 1 wherein the first determined frequency does not equal the second determined frequency.

4. A method as in claim 1 wherein the first determined frequency equals the second determined frequency and wherein the varying of the current through the secondary winding of the first magnetically saturable reactor in step (a) is done using pulses and the varying of the current through the secondary winding of the second magnetically saturable reactor in step (b) is done using pulses which do not overlap the pulses of step (a).

5. A method as in claim 1 wherein
   the primary winding of the first magnetically saturable reactor is connected in series between the power generator and the load, and
   the primary winding of the first magnetically saturable reactor and the load are connected in parallel with the secondary winding of the second magnetically saturable reactor.

6. A method as in claim 1, wherein the load is a plasma process.

7. A matching network placed between a generator and a load for matching an output impedance of the generator and an input impedance of the load, the matching network comprising;
   a first magnetically saturable reactor composed of a transformer having primary and secondary windings wound around a non-linear ferromagnetic core;
   a second magnetically saturable reactor composed of a transformer having primary and secondary windings wound around a non-linear ferromagnetic core;
   detection means for detecting the power reflected from the matching network back to the generator and for producing a power reflected signal which varies in correspondence with changes in power reflected from the matching network back to the generator; and,
   control means, coupled to the secondary winding of the first magnetically saturable reactor, to the secondary winding of the second magnetically saturable reactor and to the detection means, for varying impedance through the primary winding of the first magnetically saturable reactor and for varying impedance through the primary winding of the second magnetically saturable reactor, the control means including,
   a first current amplifier for varying current through the secondary winding of the first magnetically saturable reactor at a first determined frequency,
   a second current amplifier for varying current through the secondary winding of the second magnetically saturable reactor at a second determined frequency, separating means for separating a first electrical component of change of the power reflected signal due to varying the current through the secondary winding of the first magnetically saturable reactor by the first current amplifier from a second electrical component of change of the power reflected signal due to varying the current through the secondary winding of the second magnetically saturable reactor by the second current amplifier, and steady state adjustment means for adjusting steady state current through the secondary winding of the first magnetically saturable reactor and steady state current through the secondary winding of the second magnetically saturable reactor based on relative values of the first electrical component of change and the second electrical component of change.

8. A matching network as in claim 7 wherein the load is a plasma process.

9. A matching network as in claim 7 wherein
the first determined frequency is equal to the second determined frequency; and
the second current amplifier varies the current through the secondary winding of the second magnetically saturable reactor out of phase with respect to the varying of the current through the secondary winding of the first magnetically saturable reactor by the first current amplifier.

10. A matching network as in claim 9 wherein:
the first current amplifier includes
a first generator reference signal generator means for generating a first reference signal, the first reference signal having a varying peak voltage amplitude, and
a first amplifier which amplifies the first reference signal an amount which varies proportionally with the power reflected from the network bridge to produce a first amplified reference signal; and
the second current amplifier includes
a second generator reference signal generator means for generating a second reference signal, the second reference signal having a varying peak voltage amplitude, and
a second amplifier which amplifies the second reference signal an amount which varies proportionally with the power reflected from the network bridge to produce a second amplified reference signal.

11. A matching network as in claim 10 wherein the separating means includes
a bandpass filter which receives the power reflected signal and produces a filtered signal which includes only those components of the power reflected signal which oscillate at frequency approximately equal to the first determined frequency, the filtered signal having a varying voltage amplitude;
a first multiplying means for multiplying the voltage amplitude of the filtered signal by the voltage amplitude of the first reference signal to produce the first component of change of the power reflected signal; and,
a second multiplying means for multiplying the voltage amplitude of the filtered signal by the voltage amplitude of the second reference signal to produce the second component of change of the power reflected signal.

12. A matching network as in claim 11 wherein the steady state adjustment means includes:
first low pass filter means for receiving the first component from the first multiplying means and producing a first averaged signal based on the average magnitude of the first component signal;
first impedance control circuit means for generating and adjusting a first steady state signal with a voltage level based on the first averaged signal;
second low pass filter means for receiving the second component from the second multiplying means and producing a second averaged signal based on the average magnitude of the second component signal; and,
second impedance control circuit means for generating and adjusting a second steady state signal with a voltage level based on the second averaged signal.

13. A matching network as in claim 12 wherein the control means additionally comprises:
first summing means for summing the first steady state signal with the first amplified reference signal to produce a first control signal; and,
second summing means for summing the second steady state signal with the second amplified reference signal to produce a second control signal.

14. A matching network as in claim 9 wherein:
the first current amplifier includes
a first generator reference signal generator means for generating a first series of pulses each pulse having a voltage amplitude, and
a first amplifier which amplifies the voltage amplitude of the first series of pulses an amount which varies proportionally with the power reflected from the network bridge to produce a first amplified reference signal; and
the second current amplifier includes
a second generator reference signal generator means for generating a second series of pulses each pulse having a voltage amplitude, and
a second amplifier which amplifies the voltage amplitude of the second series of pulses an amount which varies proportionally with the power reflected from the network bridge to produce a second amplified reference signal.

15. A matching network as in claim 14 wherein pulses in the first series of pulses do not overlap with pulses in the second series of pulses.

16. A matching network as in claim 15 wherein the steady state adjustment means includes:
first low pass filter means for receiving the first electrical component from the separating means and producing a first averaged signal based on the average magnitude of the first electrical component signal;
first impedance control circuit means for generating and adjusting a first steady state signal with a voltage level based on the first averaged signal;
second low pass filter means for receiving the second electrical component from the separating means and producing a second averaged signal based on the average magnitude of the second electrical component signal; and,
second impedance control circuit means for generating and adjusting a second steady state signal with a voltage level based on the second averaged signal.

17. A matching network as in claim 16 wherein the control means additionally comprises:
  first summing means for summing the first steady state signal with the first amplified reference signal to produce a first control signal; and,
  second summing means for summing the second steady state signal with the second amplified reference signal to produce a second control signal.

18. A matching network as in claim 8 wherein the first determined frequency is not equal to the second determined frequency.

19. A matching network as in claim 18 wherein:
  the first current amplifier includes
    a first generator reference signal generator means for generating a first reference signal, the first reference signal having a varying voltage amplitude, and
    a first amplifier which amplifies the first reference signal an amount which varies proportionally with the power reflected from the network bridge to produce a first amplified reference signal; and
  the second current amplifier includes
    a second generator reference signal generator means for generating a second reference signal, the second reference signal having a varying voltage amplitude, and
    a second amplifier which amplifies the second reference signal an amount which varies proportionally with the power reflected from the network bridge to produce a second amplified reference signal.

20. A matching network as in claim 19 wherein the separating means includes
  a first bandpass filter which receives the power reflected signal and produces a first filtered signal which includes only those components of the power reflected signal which oscillate at frequency approximately equal to the first determined frequency, the first filtered signal having a varying voltage amplitude;
  a second bandpass filter which receives the power reflected signal and produces a second filtered signal which includes only those components of the power reflected signal which oscillate at frequency approximately equal to the second determined frequency, the second filtered signal having a varying voltage amplitude;
  a first multiplying means for multiplying the voltage amplitude of the first filtered signal by the voltage amplitude of the first reference signal to produce the first electrical component of change of the power reflected signal; and,
  a second multiplying means for multiplying the voltage amplitude of the second filtered signal by the voltage amplitude of the second reference signal to produce the second electrical component of change of the power reflected signal.

21. A matching network as in claim 10 wherein the steady state adjustment means includes:
  first low pass filter means for receiving the first electrical component from the separating means and producing a first averaged signal based on the average magnitude of the first electrical component signal;
  first impedance control circuit means for generating and adjusting a first steady state signal with a voltage level based on the first averaged signal;
  second low pass filter means for receiving the second electrical component from the separating means and producing a second averaged signal based on the average magnitude of the second electrical component signal; and,
  second impedance control circuit means for generating and adjusting a second steady state signal with a voltage level based on the second averaged signal.

22. A matching network as in claim 21 wherein the control means additionally comprises:
  first summing means for summing the first steady state signal with the first amplified reference signal to produce a first control signal; and,
  second summing means for summing the second steady state signal with the second amplified reference signal to produce a second control signal.

23. A matching network placed between a generator and a load for matching an output impedance of the generator and an input impedance of the load, the matching network comprising:
  a first variable impedance element;
  a second variable impedance element;
  detection means for detecting the power reflected from the matching network back to the generator and for producing a power reflected signal which varies in correspondence with changes in power reflected from the matching network back to the generator; and,
  a control means, coupled to the first variable impedance element, to the second variable impedance element and to the detection means, for varying impedance of the first variable impedance element and for varying impedance of the second variable impedance element, the control means including,
  first varying means for varying impedance of the first variable impedance element at a first determined frequency, the first varying means including
    a first generator reference signal generator means for generating a first reference signal, the first reference signal having a varying peak voltage amplitude, and
    a first amplifier which amplifies the first reference signal an amount which varies proportionally with the power reflected from the network bridge to produce a first amplified reference signal,
  second varying means for varying impedance of the second variable impedance element at a second determined frequency, the second varying means including
    a second generator reference signal generator means for generating a second reference signal, the second reference signal having a varying peak voltage amplitude, and
    a second amplifier which amplifies the second reference signal an amount which varies proportionally with the power reflected from the network bridge to produce a second amplified reference signal,
  separating means for separating a first electrical component of change of the power reflected signal due to varying the impedance of the first variable impedance element by the first varying means from a second electrical component of change of the power reflected signal due to varying the impedance of the second variable impedance element by the second varying means, and steady state adjustment means for adjusting steady state impedance of the first variable impedance and steady state impedance of the second variable impedance based on relative values of the first electrical component of change and the second electrical component of change;

wherein the first determined frequency is equal to the second determined frequency; and the second varying means varies the impedance of the second variable impedance element out of phase with respect to the varying of the first variable impedance element by the first varying means.

24. A matching network as in claim 23 wherein the separating means includes a bandpass filter which receives the power reflected signal and produces a filtered signal which includes only those electrical components of the power reflected signal which oscillate at frequency approximately equal to the first determined frequency, the filtered signal having a varying voltage amplitude;

a first multiplying means for multiplying the voltage amplitude of the filtered signal by the voltage amplitude of the first reference signal to produce the first electrical component of change of the power reflected signal; and, a second multiplying means for multiplying the voltage amplitude of the filtered signal by the voltage amplitude of the second reference signal to produce the second electrical component of change of the power reflected signal.

25. A matching network as in claim 24 wherein the steady state adjustment means includes:

first low pass filter means for receiving the first electrical component from the first multiplying means and producing a first averaged signal based on the average magnitude of the first electrical component signal;

first impedance control circuit means for generating and adjusting a first steady state signal with a voltage level based on the first averaged signal;

second low pass filter means for receiving the second electrical component from the second multiplying means and producing a second averaged signal based on the average magnitude of the second electrical component signal; and, second impedance control circuit means for generating and adjusting a second steady state signal with a voltage level based on the second averaged signal.

26. A matching network as in claim 25 wherein the control means additionally comprises:

first summing means for summing the first steady state signal with the first amplified reference signal to produce a first control signal; and, second summing means for summing the second steady state signal with the second amplified reference signal to produce a second control signal.

27. A matching network placed between a generator and a load for matching an output impedance of the generator and an input impedance of the load, the matching network comprising;

a first variable impedance element;

a second variable impedance element;

detection means for detecting the power reflected from the matching network back to the generator and for producing a power reflected signal which varies in correspondence with changes in power reflected from the matching network back to the generator; and, control means, coupled to the first variable impedance element, to the second variable impedance element and to the detection means, for varying impedance of the first variable impedance element and for varying impedance of the second variable impedance element, the control means including, first varying means for varying impedance of the first variable impedance element at a first determined frequency, the first varying means including a first generator reference signal generator means for generating a first series of pulses each pulse having a voltage amplitude, and a first amplifier which amplifies the voltage amplitude of the first series of pulses an amount which varies proportionally with the power reflected from the network bridge to produce a first amplified reference signal, second varying means for varying impedance of the second variable impedance element at a second determined frequency, the second varying means including a second generator reference signal generator means for generating a second series of pulses each pulse having a voltage amplitude, and a second amplifier which amplifies the voltage amplitude of the second series of pulses an amount which varies proportionally with the power reflected from the network bridge to produce a second amplified reference signal, separating means for separating a first electrical component of change of the power reflected signal due to varying the impedance of the first variable impedance element by the first varying means from a second electrical component of change of the power reflected signal due to varying the impedance of the second variable impedance element by the second varying means, and steady state adjustment means for adjusting steady state impedance of the first variable impedance and steady state impedance of the second variable impedance based on relative values of the first electrical component of change and the second electrical component of change;

wherein the first determined frequency is equal to the second determined frequency; and the second varying means varies the impedance of the second variable impedance element out of phase with respect to the varying of the first variable impedance element by the first varying means.

28. A matching network as in claim 27 wherein pulses in the first series of pulses do not overlap with pulses in the second series of pulses.

29. A matching network as in claim 28 wherein the steady state adjustment means includes:

first low pass filter means for receiving the first electrical component from the separating means and producing a first averaged signal based on the average magnitude of the first electrical component signal;

first impedance control circuit means for generating and adjusting a first steady state signal with a voltage level based on the first averaged signal;

second low pass filter means for receiving the second electrical component from the separating means and producing a second averaged signal based on the average magnitude of the second electrical component signal; and, second impedance control circuit means for generating and adjusting a second steady state signal with a voltage level based on the second averaged signal.

30. A matching network as in claim 29 wherein the control means additionally comprises:

first summing means for summing the first steady state signal with the first amplified reference signal to produce a first control signal; and, second summing means for summing the second steady state signal with the second amplified reference signal to produce a second control signal.

31. A matching network placed between a generator and a load for matching an output impedance of the generator and an input impedance of the load, the matching network comprising;

a first variable impedance element;

a second variable impedance element;

detection means for detecting the power reflected from the matching network back to the generator and for producing a power reflected signal which varies in correspondence with change in power reflected from the matching network back to the generator; and, control means, coupled to the first variable impedance element, to the second variable impedance element and to the detection means, for varying impedance of the first variable impedance element and for varying impedance of the second variable impedance element, the control means including, first varying means for varying impedance of the first variable impedance element at a first determined frequency, the first varying means including a first generator reference signal generator means for generating a first reference signal, the first reference signal having a varying voltage amplitude, and a first amplifier which amplifies the first reference signal an amount which varies proportionally with the power reflected from the network bridge to produce a first amplified reference signal, second varying means for varying impedance of the second variable impedance element at a second determined frequency, the second varying means including a second generator reference signal generator means for generating a second reference signal, the second reference signal having a varying voltage amplitude, and a second amplifier which amplifies the second reference signal an amount which varies proportionally with the power reflected from the network bridge to produce a second amplified reference signal, separating means for separating a first electrical component of change of the power reflected signal due to varying the impedance of the first variable impedance element by the first varying means from a second electrical component of change of the power reflected signal due to varying the impedance of the second variable impedance element by the second varying means, and steady state adjustment means for adjusting steady state impedance of the first variable impedance and steady state impedance of the second variable impedance based on relative values of the first electrical component of change and the second electrical component of change;

wherein the first determined frequency is not equal to the second determined frequency.

32. A matching network as in claim 31 wherein the separating means includes a first bandpass filter which receives the power reflected signal and produces a first filtered signal which includes only those electrical components of the power reflected signal which oscillate at frequency approximately equal to the first determined frequency, the first filtered signal having a varying voltage amplitude;

a second bandpass filter which receives the power reflected signal and produces a second filtered signal which includes only those electrical components of the power reflected signal which oscillate at frequency approximately equal to the second determined frequency, the second filtered signal having a varying voltage amplitude;

a first multiplying means for multiplying the voltage amplitude of the first filtered signal by the voltage amplitude of the first reference signal to produce the first electrical component of change of the power reflected signal; and, a second multiplying means for multiplying the voltage amplitude of the second filtered signal by the voltage amplitude of the second reference signal to produce the second electrical component of change of the power reflected signal.

33. A matching network as in claim 31 wherein the steady state adjustment means includes:

first low pass filter means for receiving the first electrical component from the separating means and producing a first averaged signal based on the average magnitude of the first electrical component signal;

first impedance control circuit means for generating and adjusting a first steady state signal with a voltage level based on the first averaged signal;

second low pass filter means for receiving the second electrical component from the separating means and producing a second averaged signal based on the average magnitude of the second electrical component signal; and, second impedance control circuit means for generating and adjusting a second steady state signal with a voltage level based on the second averaged signal.

34. A matching network as claimed in claim 33 wherein the control means additionally comprises:

first summing means for summing the first steady state signal with the first amplified reference signal to produce a first control signal; and, second summing means for summing the second steady state signal with the second amplified reference signal to produce a second control signal.

35. A matching network as in claim 35 wherein the load is a plasma process.

* * * * *

UNITED STATES PATENT AND TRADEMARK OFFICE
CERTIFICATE OF CORRECTION

PATENT NO. : 4,951,009
DATED : August 21, 1990
INVENTOR(S) : Kenneth S. Collins, et al.

It is certified that error appears in the above-identified patent and that said Letters Patent is hereby corrected as shown below:

Title page, item (75) should read --

Kenneth S. Collins, Morgan Hill, Craig Roderick, Walnut Creek, both of California. --.

Signed and Sealed this

Ninth Day of February, 1993

Attest:

STEPHEN G. KUNIN

Attesting Officer

Acting Commissioner of Patents and Trademarks